United States Patent
Jung et al.

(10) Patent No.: US 8,670,266 B2
(45) Date of Patent: Mar. 11, 2014

(54) NON-VOLATILE FLIP-FLOP

(75) Inventors: Seong-Ook Jung, Seoul (KR); Kyungho Ryu, Seoul (KR); Youngdon Jung, Seoul (KR); Jisu Kim, Seoul (KR); Jung Pill Kim, San Diego, CA (US); Seung H. Kang, San Diego, CA (US)

(73) Assignees: QUALCOMM Incorporated, San Diego, CA (US); Industry-Academic Cooperation Foundation, Yonsei University, Seoul (KR)

( * ) Notice: Subject to any disclaimer, the term of this patent is extended or adjusted under 35 U.S.C. 154(b) by 20 days.

(21) Appl. No.: 13/361,760

(22) Filed: Jan. 30, 2012

(65) Prior Publication Data
US 2013/0194862 A1 Aug. 1, 2013

(51) Int. Cl.
G11C 11/00 (2006.01)
G11C 11/14 (2006.01)
G11C 7/10 (2006.01)

(52) U.S. Cl.
USPC ........... 365/158; 365/154; 365/156; 365/171; 365/189.05

(58) Field of Classification Search
USPC ........................................ 365/158
See application file for complete search history.

(56) References Cited

U.S. PATENT DOCUMENTS

| | | | | |
|---|---|---|---|---|
| 6,992,935 | B2 * | 1/2006 | Ooishi | 365/189.05 |
| 7,961,005 | B1 * | 6/2011 | Kim et al. | 326/46 |
| 8,243,502 | B2 * | 8/2012 | Sakimura et al. | 365/158 |
| 8,406,064 | B2 * | 3/2013 | Jung et al. | 365/189.05 |
| 2004/0066669 | A1 * | 4/2004 | Ooishi | 365/173 |
| 2011/0273925 | A1 | 11/2011 | Yamamoto et al. | |

FOREIGN PATENT DOCUMENTS

WO 2012009179 A1 1/2012

OTHER PUBLICATIONS

International Search Report and Written Opinion—PCT/US2013/023930—ISA/EPO—Jun. 5, 2013.

* cited by examiner

*Primary Examiner* — Son Mai
(74) *Attorney, Agent, or Firm* — Sam Talpalatsky; Nicholas J. Pauley; Joseph Agusta

(57) ABSTRACT

A flip-flop has an output control node and an isolation switch selectively couples a retention sense node to the output control node. A sense circuit selectively couples an external sense current source to the retention sense node and to magnetic tunneling junction (MTJ) elements. Optionally a write circuit selectively injects a write current through one MTJ element and then another MTJ element. Optionally, a write circuit injects a write current through a first MTJ element concurrently with injecting a write current through a second MTJ element.

26 Claims, 9 Drawing Sheets

NON-VOLATILE FLIP-FLOP

FIELD OF DISCLOSURE

The present disclosure relates non-volatile power down memory back-up and, more particularly to register cells with non-volatile magnetic resistive memory back-up.

BACKGROUND

In the art relating to portable computation and communication devices, for example "smart phones," power consumption is an ever-present concern. At the same time there is an equally present demand for higher computational power and increased storage, both of which are directly counter to the concern for lower power consumption.

One known technique for reducing power consumption is configuring circuitry to have a power-down or sleep mode, collectively referenced in this disclosure as "sleep mode." There is no uniform specification as to the actions performed in entering the sleep mode or awakening back to an operational state. In general, though, entering sleep mode involves detecting a period of inactivity, e.g., detecting no input from a user of a hand-held multimedia device while in an operational state, such as watching a video, in which no user input is expected and, in response, disabling certain clocks and lowering voltages on some internal power supply rails. The disabling of the clocks reduces switching power, and lowering the voltages reduces leakage currents.

However, circuits entering the sleep mode include register files and regions of static random access memory ("SRAM"), both of these being addressable flip-flops, storing machine states, e.g., states in the processing of an application. These flip-flops are volatile memory, meaning that power is required to maintain state. Some of the machine states, though, if lost upon entering the sleep mode, can require the awakening process to include an entire re-boot of the system. As can be appreciated, such a requirement could defeat the purposes of having the sleep mode.

One known method to store the machine state as it existed at the time of entering the sleep mode is to copy the content of the relevant flip-flops to a non-volatile storage, prior to disabling the clocks and lowering the power supply voltages. There is a range of known non-volatile memory techniques for this purpose. Among these known non-volatile memory techniques is magnetic tunnel junction ("MTJ") storage.

Known MTJ techniques for storing flip-flop state, however, employ circuitry merged with that of the flip-flop. As has been long known this merging of circuitry imposes costs, such as increased propagation delay and difficulty in optimizing both latch performance and sensing current.

SUMMARY

Exemplary embodiments include a novel MTJ storage of flip-flop states providing, among other features and benefits, flip-flop circuitry separated from the MTJ circuit, which in turn provides, among other features and benefits, high flip-flop speed during normal operation, separate and independent of the MTJ circuit.

One exemplary embodiment can include a non-volatile flip-flop apparatus that, in various aspects, can have flip-flop having an output control node, an isolation switch selectively coupling a retention sense node to the output control node, a sense circuit configured to selectively couple an external sense current source to the retention sense node, and a resistive element, having a magneto-resistive element, selectively coupled by the sense circuit to the retention sense node.

In an aspect a write circuit can be included, and can be configured to receive a data and selectively inject a write current through the magneto-resistive element, in a direction based on the data.

In another aspect the sense circuit can include a sense current head switch configured to receive a write enable and, in response, to uncouple the retention sense node from the external sense current source.

In another aspect the sense circuit can be configured to have a precharging mode and a sensing mode, and to precharge the retention sense node during the precharging mode with a precharging current, and to pass the precharging current through the magneto-resistive element during the sensing mode. In an aspect further to this aspect the sense circuit can be configured to control the isolation switch to couple the retention sense node to the output control node during the sensing mode.

In one aspect the magneto-resistive element can include a first magnetic tunnel junction (MTJ) element and a second MTJ element. In an aspect further to this aspect the first MTJ element can have a free layer and a pinned layer, and the second MTJ element can have a free layer and a pinned layer, and the local write circuit can be configured to receive a data and selectively inject a write current through the first MTJ element in a first direction with respect to its free layer and its pinned layer, and to selectively inject a write current through the second MTJ element in a second direction, wherein the second direction is the same as the first direction.

In a still further aspect, the sense circuit can be configured to control the isolation switch to couple the retention sense node to the output control node during the sensing mode.

In another aspect the sense circuit can be configured to uncouple, during the precharging mode, the first MTJ element from ground concurrent with uncoupling the second MTJ element from ground, and to couple, during the sensing mode, the first MTJ element to ground concurrent with coupling the second MTJ element to ground.

In an aspect the sense circuit can include a sink switch configured to selectively concurrently couple the first MTJ element and the second MTJ element to ground and concurrently uncouple the first MTJ element and the second MTJ element from ground.

In another aspect, the sense circuit can include a sense current head switch configured to receive a write enable signal having a write enabling value and a not write enabling value, and, in response to the write enabling value, to uncouple the retention sense node from the external sense current source.

One or more methods according to various exemplary embodiments can provide non-volatile storage of a logical state of a flip-flop output terminal and, in various aspects, can include forming a sense voltage on a sensing node of a resistance memory in accordance with a storage state of the resistance memory, coupling the sensing node to an output control node of a flip-flop, latching the output control node of the flip flop in accordance with the sense voltage of the coupled sensing node, and uncoupling the sensing node from the output control node of the flip flop.

In an aspect, one or more methods according to various exemplary can further include writing the resistance memory to an updated storage state corresponding to the logical state of the output control node. In an aspect, writing the resistance memory can include injecting a write current in a direction through a resistance memory element of the resistance memory, the direction corresponding to the storage state.

In another aspect, forming the sense voltage on the sensing node of the resistance memory can include precharging a parasitic capacitance coupled to the sense node followed by forming a current path from the sense node through the resistance memory element to a ground reference.

In a further aspect, precharging the parasitic capacitance can include forming a current path from a voltage rail to the sense node, and forming the current path from the voltage rail to the sense can include forming a series connection from the voltage rail to the sense node, the series connection including a write current head switch in an ON state in series with a sense current transistor in an ON state.

In an aspect, switching the state of the resistance memory can include, concurrent with injecting the write current, switching the write current head switch to an OFF state.

An apparatus according to various exemplary embodiments can provide non-volatile storage of a logical state of a flip-flop output terminal and can include, in various aspects, means for forming a sense voltage on a sensing node of a resistance memory, the sense voltage being indicative of the storage state of the resistance memory, means for switchably coupling the sensing node to an output control node of the flip-flop, means for latching the output control node of the flip-flop at a logical state in accordance with the sense voltage received at the output control node through said coupling of the sensing node.

One or more methods according to various exemplary embodiments can provide non-volatile storage of a logical state of a flip-flop, and can comprise step of forming a sense voltage on a sensing node of a resistance memory switchable between a plurality of storage states, the sense voltage being indicative of the storage state of the resistance memory, step of coupling the sensing node to an output control node of the flip-flop, step of latching the output control node of the flip-flop at a logic state in accordance with the sense voltage received at the output control node through said coupling the sensing node, and step of uncoupling the sensing node from the output control node of the flip-flop.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
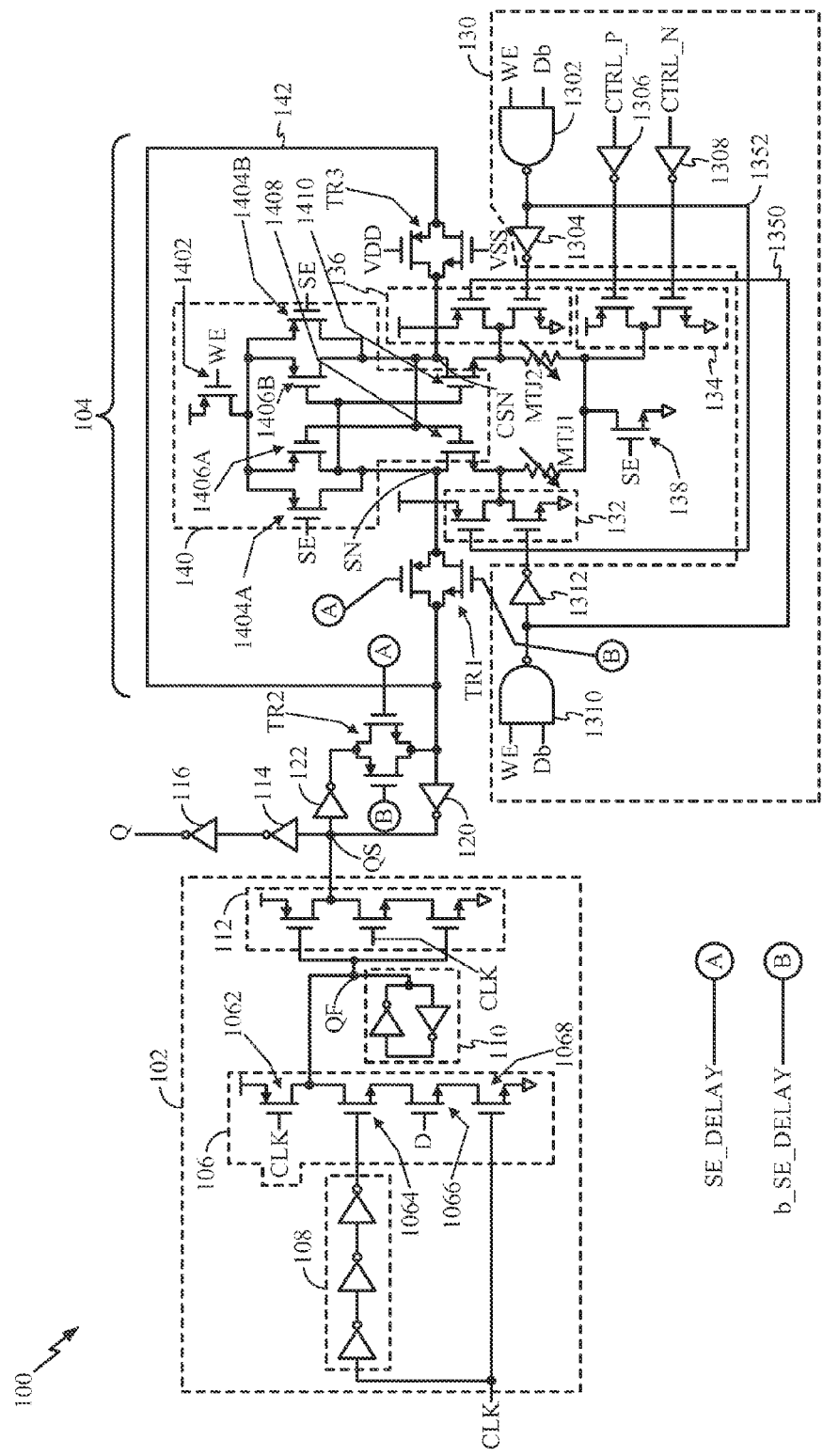
FIG. 1 shows a schematic diagram of one isolatable retention flip-flop according to one exemplary embodiment.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Regarding the meaning of the terms "high" and "low" as used in this disclosure in reference to a signal or voltage level, the term mean, except where otherwise stated or made clear from its context to have a different meaning, respective voltages relative to the threshold voltage of the NMOS and PMOS transistors that are either explicitly shown or inherent in the disclosed example as relating to the high or low signal or voltage. More particularly, the term "high" signal or voltage means a voltage that is concurrently above the threshold voltage of the NMOS transistors and below the threshold of the PMOS transistors, and the term "low" signal or voltage means a voltage that is concurrently below the threshold voltage the NMOS transistors and above (in terms of magnitude, which can be "below" in a negative direction) the threshold of the PMOS transistors. The terms OFF and ON, as used in this disclosure in reference to the conducting state of a PMOS or NMOS transistor shall mean, except where otherwise stated or made clear from the context to have a different meaning, respective conducting states within the ordinary and customary meaning of "OFF" and "ON" in the relevant art.

One exemplary embodiment provides an isolatable retention flip-flop having among other features, a novel combination of a CMOS flip-flop and a retention circuit, and includes a direct D to Q path wholly independent from the MTJ retention circuit during power-up operation. In an aspect the CMOS flip flop can have an internal Q state node that can, for example, control an external Q terminal. In one aspect the MTJ retention circuit can have structure configured to selectively switch between being coupled to, and isolated from the internal Q state node. In an aspect, selective coupling of the MTJ retention circuit to the internal Q-state node can be through a transmission gate that is switched off during regular power-on operation and is switched on only during certain sleep mode operations utilizing the MTJ retention circuit, as described in greater detail at later sections.

In an aspect, the MTJ retention circuit includes a write head switch that selectively uncouples the sense current transistors from the voltage rail. This aspect provides, among other features and benefits, additional control of MTJ write current.

FIG. 1 shows a schematic diagram of one isolatable retention flip-flop (hereinafter "IRFF", for brevity) 100 according to one exemplary embodiment. Referring to FIG. 1, the IRFF 100 includes a semi-conductor "D" flip-flop ("DFF") circuit 102, and an isolatable retention circuit 104. It will be understood that the particular DFF circuit 102 is only one example CMOS flip-flop that can be used in practices according to the exemplary embodiments. Persons of ordinary skill the art, having view of this disclosure, will readily identify alternative implementations of a "D" type flip-flop that can be substituted for the DFF circuit 102.

The example DFF circuit 102 includes a logic gate 106 formed of a ladder of four switches from VDD to ground comprising top PMOS 1062, NMOS 1064, NMOS 1066, and bottom NMOS 1068. The CLK controls the top PMOS 1062 and the bottom NMOS 1068, a delayed, inverted version of CLK provided by the CLK delay/inverter 108 controls NMOS 1064, and the D input to the DFF circuit 102 controls the NMOS 1066. A node (shown but not separately numbered) coupling the drain of the top PMOS 1062 to the source of NMOS 1064 couples to a latch 110 formed of parallel, mutually opposite inverters (shown but not separately numbered). This coupling point of the top PMOS 1062, NMOS 1064 and latch 110 will be referenced as "the internal latch node QF." The internal latch node QF, in turn, is switchably coupled through a clock-enabled tri-state inverting buffer 112 to a flip-flop output Q control node QS. As can be seen, the flip-flop output Q control node QS can be input to the series of Q inverting drive buffers 114 and 116 and, therefore, establishes the output Q value.

With continuing reference to FIG. 1, the isolatable retention circuit 104 includes a first magnetic tunnel junction (MTJ) element, labeled MTJ1, and a second MTJ labeled MTJ2. As described in greater detail below, MTJ1 and MTJ2 can be written to store the Q value of the DFF circuit 102 prior to entering a sleep mode, and can be sensed or read upon awakening to restore the DFF circuit 102 to that prior state. In one aspect, MTJ1 and MTJ2 can be written in a complementary manner, for example to Q value of logical "1," MTJ1 can be written to a parallel, low resistance magnetization state and MTJ2 oppositely written to an anti-parallel, high resistance magnetization state, and written to store a Q value of logical "0" by writing MTJ1 to the anti-parallel, high resistance magnetization state and MTJ2 to the complementary, parallel, low resistance magnetization state. It will be understood that this example of relative magnetization states for MTJ1 and MTJ2 to store a logical "1" and "0" is arbitrarily selected, without preference as to assignment or order.

Referring still to FIG. 1, in an aspect of various exemplary embodiments, the isolatable retention circuit 104 can include a first transmission gate TR1 coupling a retention sense node SN to the flip-flop output Q control node QS through an inverter 120. The isolatable retention circuit 104 also includes an MTJ output latch (not separately numbered) formed of an inverting feedback path implemented by a second transmission gate TR2 in series with an inverter 122. As will be described in greater detail below, during a power-up operation the first transmission gate TR1 is ON and the second transmission gate TR2 is "OFF", which provides for the sensed voltage on the retention sense node SN to be transferred to the flip-flop output Q control node QS. After power-up the transmission gate TR1 is OFF and the transmission gate TR2 is ON which, as will be described in greater detail at later sections, latches the state of the flip-flop output Q control node QS. In the FIG. 1 example, control of the first transmission gate TR1 and the second transmission gate TR2 is by delayed versions of a sense enable ("SE") control signal and a complementary SE ("b_SE"), the delayed versions labeled "SE_DELAY" and "b_SE_DELAY," respectively.

In an aspect the isolatable retention circuit 104 also includes a third transmission gate TR3 connected to the first transmission gate TR1 and the second transmission gate TR2 by a coupling 142, and that can be in an always OFF state as shown by the example coupling of the PMOS gate (shown but not separately numbered) to VDD and the NMOS gate (shown but not separately numbered) to VSS or ground, for purposes of load balancing.

Referring still to FIG. 1, in an aspect the isolatable retention circuit 104 can be formed of a write logic 130, hereinafter referred to as a "local write logic" 130, controlling a first write switch 132, a second write switch 134 and a third write switch 136, and each of these can be implemented by a pull-up PMOS switch (shown but not separately numbered in FIG. 1), and a pull-down NMOS switch (shown but not separately numbered in FIG. 1). The local write logic 130 is configured, as will be described in greater detail below to controls the first write switch 132, the second write switch 134, and the third write switch 136 in response to receiving an input data ("D") and complementary input data ("Db"), in combination with receiving global write control signals, such as a global write enable ("WE"), a CTRL_N, and a CTRL_P. In an aspect, in response to certain values of the described global write control signals, the local write logic 130 controls the first write switch 132, the second write switch 134, and the third write switch 136 to selectively inject write currents through MTJ1 and MTJ2.

In an aspect an NMOS sink switch 138 can be provided and controlled by, for example, SE, to selectively couple the lower end of both MTJ1 and MTJ2 to ground. As will be described in greater detail at later sections, in accordance with one aspect the NMOS sink switch 138 can be controlled, for example by SE, to establish or contribute to the temporary establishment of one or more write current injection paths through one or both of MTJ1 and MTJ2. As will also be described in greater detail, in one further aspect, precharging and sense operations in accordance with various exemplary embodiments can include switching off the NMOS sink switch 138, for example by coupling its gate to SE, to couple and uncouple the lower end of MTJ1 and MTJ2 to and from ground. As will be understood, this coupling and uncoupling using the NMOS sink switch 138 can provide precharging of a sense node capacitance and provide sense current paths through MTJ1 and MTJ2.

Referring still to FIG. 1, as will be described in greater detail at later sections, in an aspect the write control logic 130, based on D, Db, WE, CTRL_N, and CTRL_P, can control the first write switch 132, the second write switch 134, and the third write switch 136 to perform a two-step write cycle, having one step that injects a write current through MTJ1, and another write step that injects a write current (of a selectable direction) through MTJ2. In an aspect, the value of D and Db dictates the direction of the write currents.

With continuing reference to FIG. 1, the isolatable retention circuit 104 can also include a sense circuit 140 that, under control of a select enable ("SE"), can control precharging and sensing processes that will be described in greater detail below. In an aspect, the current supply to the sense circuit 140 can be selectively enabled and disabled by a sense head switch 1402 As will be described in greater at later sections, according to one aspect, WE is at a logic "1" value during write operations and at logic "0" during sensing operations. Since the sense head switch 1402 is a PMOS transistor, no current can flow into the sense circuit 140 during write operations. This can provide, among other benefits, elimination of sense current flowing into the sense circuit 140, and then through MTJ1 or MTJ2 during write operations. As will be appreciated, this sense head switch feature can therefore provide closer control of the write current.

In describing the sense circuit 140 it will be understood that, as previously identified, in one aspect MTJ1 and MTJ2 can be written to represent the Q (or QS node) in a complementary manner, meaning that one of MTJ1 and MTJ2 can be written to the parallel, low resistance state and the other of MTJ1 and MTJ2 written to the anti-parallel, high resistance state, with the selection of which is written to which state depending on the Q value. It will be appreciated by persons of ordinary skill in the art from the present disclosure that the sense circuit 140 provides, in accordance with one or more exemplary embodiments, for reliable and relatively simple reading of the complementary magnetization states of MTJ1 and MTJ2, without requiring a common reference voltage generator. As will be understood, methods and systems according to the various exemplary embodiments can provide reading of the complementary written MTJ1 and MTJ2 by a comparative sensing aspect that can exploit the difference in the resistance of MTJ1 and MTJ2, as opposed to measuring a sense voltage against a common reference voltage.

Referring still to FIG. 1, in an aspect the sense circuit 140 can include a first branch precharge enable switch 1404A, controlled by SE to selectively couple the source (shown but not separately numbered) of the sense head switch 1402 to a sense node SN. In an aspect, a first branch upper current switch 1406A can be arranged in parallel with the first branch precharge enable switch 1404A. In a further aspect, the sense circuit 140 can include a second branch precharge enable switch 1404B, also controlled by SE, to selectively couple the source of the sense head switch 1402 to a complementary sense node CSN. In an aspect, a second branch upper current switch 1406B can be arranged in parallel with the second branch precharge enable switch 1404B and, further a first branch lower sense current switch (shown but not separately numbered in FIG. 1) can selectively couple SN to an upper end of MTJ1. Similarly, in an aspect, a second branch lower sense current switch (shown but not separately numbered in FIG. 1) can selectively couple CSN to an upper end of MTJ2.

In one example that provide the complementary writing aspect, the gate (shown but not separately numbered) of the first branch upper current switch 1406A can be coupled to the gate (shown but not separately numbered) of the first branch lower sense current switch, and these gates cross-coupled to CSN. In a similar manner, also in accordance with the comparative sensing aspect, the gate (shown but not separately numbered) of the second branch upper current switch 1406B can be coupled to the gate (shown but not separately numbered) of the second branch lower sense current switch, and these gates cross-coupled to SN. As will be described in greater at later sections, methods and systems according to various exemplary embodiments can, in an aspect, store binary bit as complementary states of MTJ1 and MTJ2, and the above-described sense circuit 140, in combination with described control and timing of TR1 and TR2 and other described structures, can provide reliable sensing of the MTJ1 and MTJ2 states.

Referring to FIG. 1, aspects of MTJ1 and MTJ2 will be described. First, as can be seen, the FIG. 1 graphical symbol for MTJ1 and MTJ2 includes an arrow that points downward. For purposes of this disclosure it will be understood that the base of the arrow represents the end coupled directly to the pinned layer and the point of the arrow represents the end coupled directly to the free layer. It will therefore be understood that in embodiments such as the FIG. 1 IRFF 100, having the depicted embodiments of the isolatable retention circuit 104, the MTJ1 and MTJ2 are arranged in the same orientation. It will be appreciated that "orientation" in this context means with respect to the flow of the sense current during sense operations. As a specific example, when the FIG. 1 isolatable retention circuit 104 is in a sense mode, the portion of the sense current flowing through MTJ1 will pass from the pinned layer to the free layer, as will the portion of the sense current passing through MTJ2 with respect to its pinned layer and its free layer. Other embodiments, described in greater detail at later sections, include MTJ1 and MTJ2 having opposite directions.

Concepts shown by the example IRFF 100 and its isolatable retention circuit 104 will be further understood from description of an example writing process according to one exemplary embodiment. As previously described, the FIG. 1 isolatable retention circuit 104 includes a local write logic 130 and, according to one exemplary embodiment, in response to global write control signals WE, CTRL_P and CTRL_N, it controls the first, second, and third write switches, labeled 132, 134 and 136, respectively, to perform a two-step or two-phase write process. The steps or phases (collectively "steps") can be performed in either order; one step injects a write current through MTJ1 and one step injects a write current through MTJ2.

One example of one two-step write process according to one exemplary embodiment will be described in reference to FIGS. 2A and 2B. It will be understood that "write process" does not necessarily reverse the state of MTJ1 and MTJ2, as MTJ1 and MTJ2 may already be in the state that is the target state of the write process. Accordingly the state of MTJ1 and MTJ2 after the writing process may be alternatively referred to as an "updated state" or "updated storage state." FIGS. 2A and 2B include a timing diagram 250 that references the period of the entire two-step write process as "WC," the first step as "WC1," and the second step as "WC2." It can be assumed, but it is not necessary, that WC1 and WC2 are equal, i.e., ½ of WC. To simplify graphics the write circuit shown as local write logic 130 in FIG. 1 is shown in FIGS. 2A and 2B by an example implementation in which PMOS driver 1322 and NMOS driver 1324 implement the FIG. 1 first write switch 132, PMOS driver 1342 and NMOS driver 1344 implement the FIG. 1 second write switch 134, and PMOS driver 1362 and NMOS driver 1364 implement the FIG. 1 third write switch 136.

It will be understood that during two-step write processes in methods according to one embodiment that the sense enable SE signal is at a "0" state, switching off the NMOS sink switch 138. Although SE connects to the gates of the first branch precharge enable switch 1404A and the second branch precharge enable switch 1404B, no sense current will pass because WE is at a "1" value, switching off the FIG. 1 sense head switch 1402. The FIG. 1 sense circuit 140 is therefore inoperative and, at least with respect to the write process, irrelevant. Accordingly, to focus FIGS. 2A and 2B on aspects relating to the example write process, the FIG. 1 sense circuit 140 is, in these figures, shown by dotted lines.

Figure 2A:
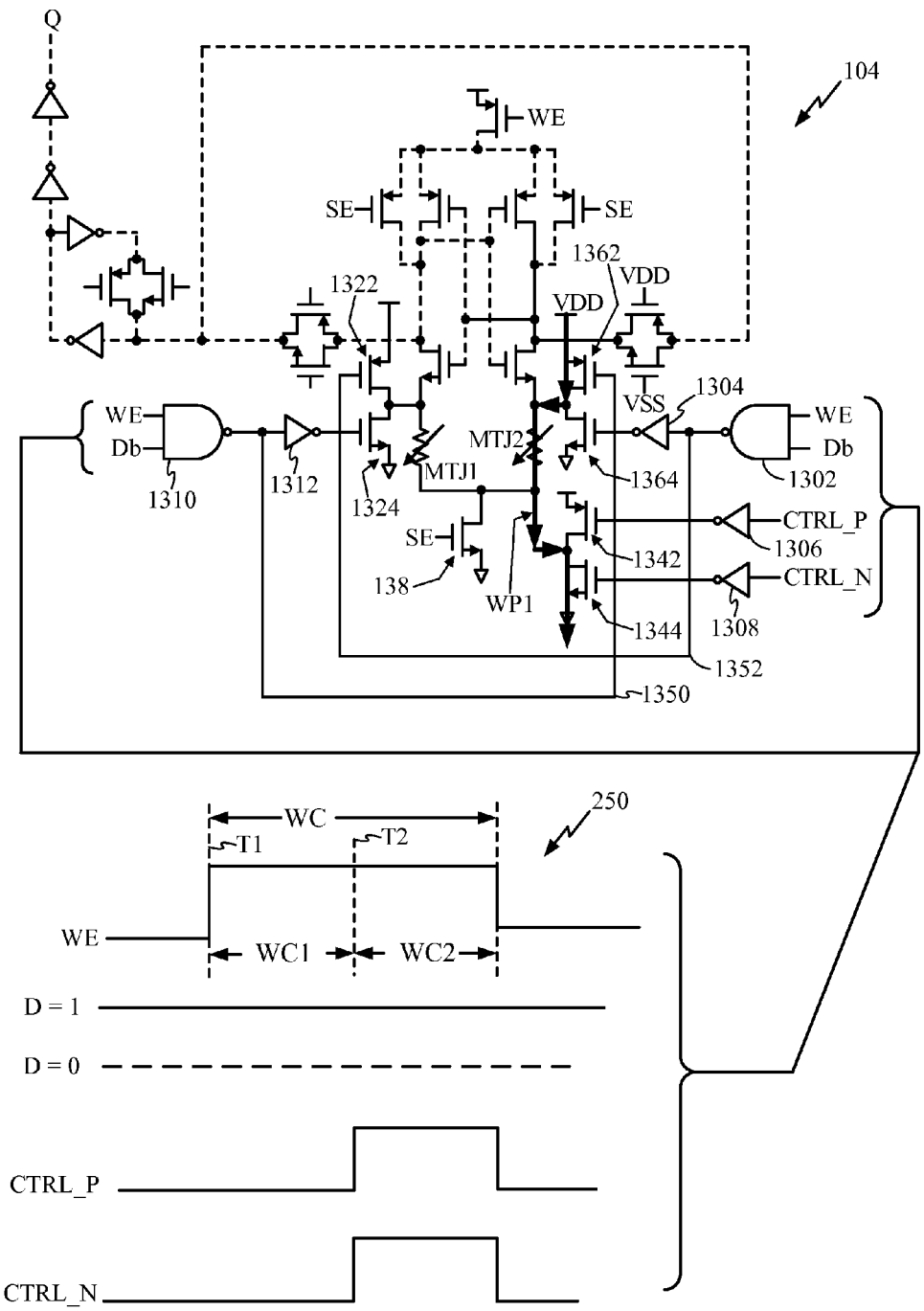
FIG. 2A shows an equivalent circuit and current flow diagram of the FIG. 1 example isolatable retention flip-flop during a first write step of one write process according to a two-step write aspect of one isolatable retention flip-flop according to one exemplary embodiment.
Figure 2B:
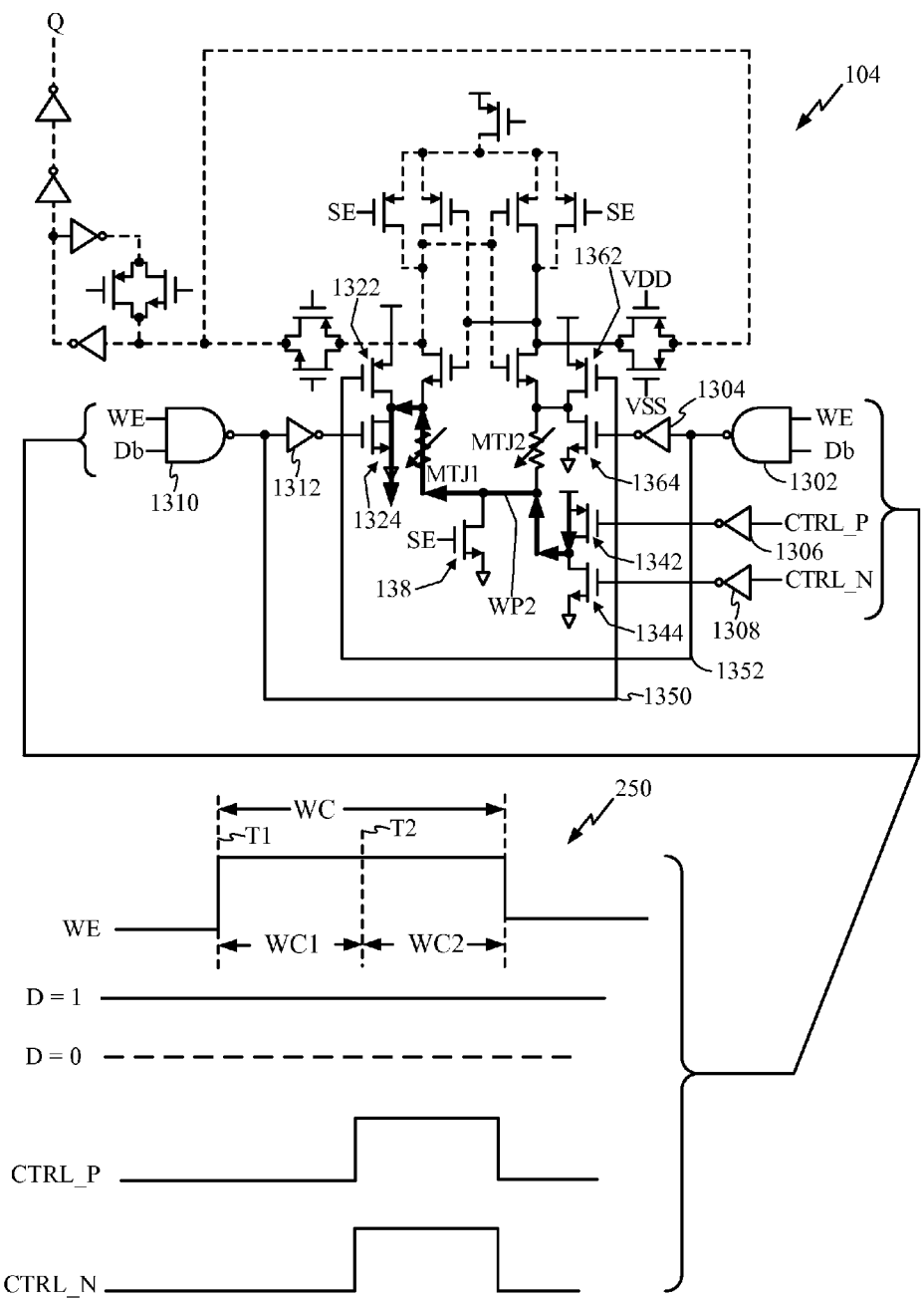
FIG. 2B shows an equivalent circuit and current flow diagram of the FIG. 1 example isolatable retention flip-flop during a second write step of one write process according to a two-step write aspect of one isolatable retention flip-flop according to one exemplary embodiment.

Referring to FIG. 2A, operations and states depicted will be alternatively referred to as a "first step." It will be understood that assigning which of FIGS. 2A and 2B shows the "first step" is arbitrary because, as previously identified, there is no necessary limitation as to order. In this example, CTRL_P and CTRL_N have the same waveform, which provides an initial condition of the PMOS drivers 1342 being OFF and the NMOS drivers 1344 being ON, and further provides for both the PMOS drivers 1342 and the NMOS drivers 1344 being OFF during read operation, for proper sensing of the MTJ1 and MTJ2 state. It will be understood that the polarities of the global write signals WE, CTRL_P and CTRL_N correspond to the particular arrangement and configuration of components forming the FIG. 1 local write logic 130, as well as the FIG. 1 first write switch 132, second write switch 134 and third write switch 136. Persons of ordinary skill in the art, having view of the present disclosure, will see alternative implementations that may employ global write control signals having polarities different from the examples shown in FIGS. 2A and 2B.

With continuing reference to FIG. 2A, prior to time T1, CTRL_P and CTRL_N are at their initial low state, which in the depicted example logic corresponds to an initial logical state of "0." Passing through inverters 1306 and 1308, this results in the pull-up PMOS driver 1342 being OFF and the NMOS pull-down driver 1344 being ON. At time T1 the following logical events occur: WE goes from low to high, which in the example logic is a logical "0" to a logical "1," and CTRL_P and CTRL_N remain at their logical "0." In aspects having the sense head switch (shown but not numbered on FIG. 2A, shown and numbered on FIG. 1 as 1402), WE going from a low to a high switches the sense head switch OFF. Since D is assumed to be "0" for this example, the output of the first NAND gate 1302 is logical "1," while the output of the second NAND gate 1310 is logical "0." The logical "1" output of the first NAND gate 1302 passes through the inverter 1304 to become a logical "0" that switches OFF the NMOS pull-down driver 1364. The logical "1" output of the first NAND gate 1302 also, acting through connection 1352, switches OFF the pull-up PMOS driver 1322. The logical "0" output of the second NAND gate 1310 on the other hand, acting for example through connection 1350, switches ON the PMOS pull-up driver 1362 and, acting through inverter 1312, switches ON the pull-down NMOS driver 1324.

With continuing reference to FIG. 2A, and continuing with description of states resulting from the switch of WE from logical "0" to logical "1 at time T1, CNTL_N and CNTL_P remain at their initial state of logical "0." Therefore, the initial state of the PMOS pull-up driver 1342 and NMOS pull-down driver 1344 (i.e., the FIG. 2 implementation of the FIG. 1 second write switch 134), which is controlled by CNTL_N and CNTL_P, does not change at T1. As previously described, this initial state of the PMOS pull-up driver 1342 and NMOS pull-down driver 1344 is the PMOS pull-up driver 1342 being OFF and the NMOS pull-down driver 1344 being ON.

Referring still to FIG. 2A, the above-described example first-step write process in a method according to one exemplary embodiment establishes, starting at T1 and over a time period "WC1," a write current WP1 through MTJ2. According to the previously described orientation of MTJ2, shown by its downward pointing arrow, the write current on the write current WP1 passes from the pinned layer to the free layer, switching MTJ2 to a "1" state. It will be understood that the "1" state can represent D of "0" because the sensing step, which is described in greater detail at later sections, can generate sense voltages having an inverse relation to the value of D that is represented With respect to the amplitude of the write current WP1, as known to persons of ordinary skill in the art having view of this disclosure, the value is in part application specific based on known considerations, for example, maximum bit error rate (BER), specific structure and technology of the MTJs. Such persons, by applying conventional MTJ technology know-how such persons possess to this disclosure can readily determine these application specific conditions and the range of values of the write current WP1. Further detailed description of the write current amplitude is therefore omitted.

Referring to FIG. 2B, an example of a second step in the above-described two-step write process for a D of "0" will be described. As will be understood, this second step will write MTJ1 to the "0" state, which will be described. The example second step is assumed to begin at T2 and continue for the duration WC2. Referring to the timing diagram 250, at T2 both CTRL_N and CTRL_P change from a "0" to a "1" state. WE remains at "1" and D, of course, remains at "0." This means that at T2 the PMOS driver 1362 coupling MTJ2 to VDD remains ON, and the NMOS pull-down driver 1364 remains OFF. The change of CTRL_N and CTRL_P from "0" to "1," however, reverses the state of the PMOS pull-up driver 1342 and NMOS pull-down driver 1344 (i.e., the FIG. 2A-2B implementation of the FIG. 1 second write switch 134), such that the PMOS pull-up driver 1342 is now ON and the NMOS pull-down driver 1344 is OFF. Therefore, VDD is now applied to both ends of MTJ2, and write current will not be injected through it. On the other hand, the ON state of the PMOS pull-up driver 1342 couples VDD to one end of MTJ1, while the ON state of the NMOS pull-down driver 1322 couples the other end of MTJ1 to ground. The result, referring still to FIG. 2B, is the establishment of write current WP2 through MTJ1. The write current WP2 switches the MTJ1 to a "0" state, which is opposite the "1" state to which the write current WP1 switched MTJ2.

Figure 3:
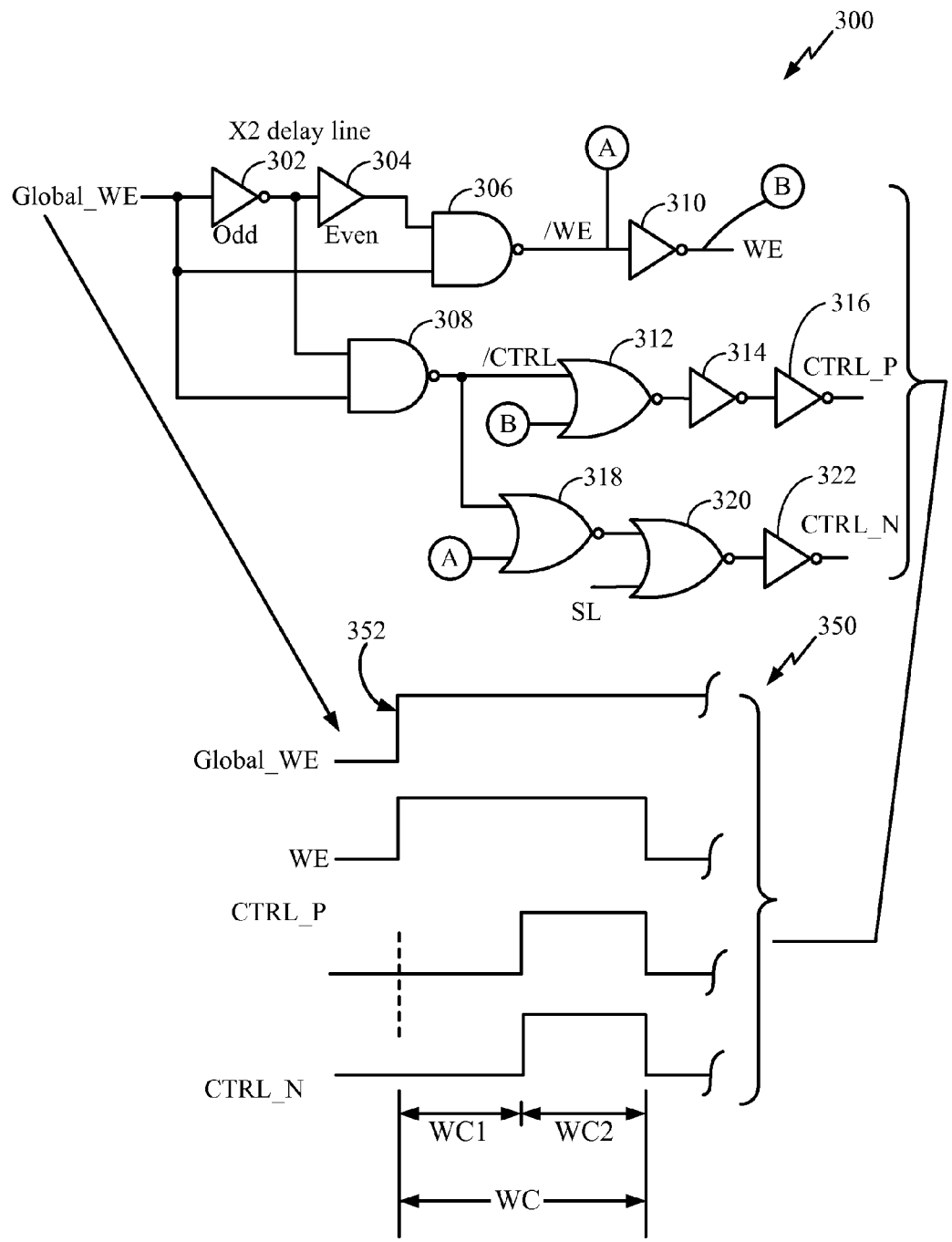
FIG. 3 shows a schematic diagram of one example global control signal generation logic for one isolatable retention flip-flop according to one exemplary embodiment.

With respect to generation of the above-described global write signals WE, CTRL_P and CTRL_N for practices according to one or more exemplary embodiments, FIG. 3 shows global write signal generator 300 as one example implementation. It will be understood that the FIG. 3 global write signal generator 300 is only one example implementation, and that persons of ordinary skill in the art having view of this disclosure may identify alternative implementations of logic to generate the described global write signals or equivalents thereof for generating control signals usable by a local write.

Referring to FIG. 3, the global write signal generator 300 includes an inverting delay element 302 in series with a non-inverting delay element 304, each having a delay of ½ WC, the previously described write cycle time for the two-step write according to one or more exemplary embodiments. The output of the non-inverting delay element 304 can be input to one of two inputs (shown but not separately numbered) of the two-input NAND gate 306. A given global write enable signal ("Global_WE"), can be input the other input of the two-input NAND gate 306, and one of the two inputs (shown but not separately numbered) of another two-input NAND gate 308. The output of the two-input NAND gate 306, "/WE," is the complement of the previously described WE, which is generated by passing /WE passes through an inverter 310.

With continuing reference to FIG. 3, the global write signal generator 300 generates CTRL_P by coupling the output of the two-input NAND gate 308, labeled "/CTRL," to one input (shown but not separately numbered) of a two-input NOR gate 312, with WE being coupled to the other of the two-input NOR gates 312 inputs. The output of the two-input NOR gate 312 is delayed by a series arrangement of inverting gate 314 and then inverting gate 316, which outputs CTRL_P. The global write signal generator 300 generates CTRL_N by coupling the previously described /CTRL output of a two-input NAND gate 308 and the previously described /WE, respectively, to the inputs of another two-input NOR gate 318, and then gating the output of the two-input NOR gate 318 with the previously described sense enable SE through another two-input NOR gate 320. The output of the two-input NOR gate 320 is the complement of CTRL_N, which is then passed through an inverting gate 322 to generate CTRL_N.

Referring still to FIG. 3, timing diagram 350 shows the WE, CTRL_P and CTRL_N generated by the global write signal generator 300, in response to a rising edge 352 of a Global_WE signal, assuming the Global_WE signal has been at a "0" state for more than WC prior to the rising edge 352.

One example sensing process for detecting the state of MTJ1 and MTJ2 in the isolatable retention circuit 104 of the FIG. 1 IRFF 100, in a method according to one or more exemplary embodiments, will now be described. In an aspect, the sensing process can be a two-step or two-phase process, having a pre-charging step or phase to charge parasitic capacitance on the sensing node SN and a sense step or phase in which sense current flows through MTJ1 and MTJ2 to establish a sense voltage on the sending node SN. One example process for a pre-charging will be described in reference to FIG. 4A and one example process for a sense step or phase will be described in reference to FIG. 4B. The example process will be described assuming MTJ1 is in a high resistance magnetization state and MTJ2 is in a low resistance magnetization state. The example will also assume that WE is high, such that the sense head switch 1402 is ON.

Figure 4A:
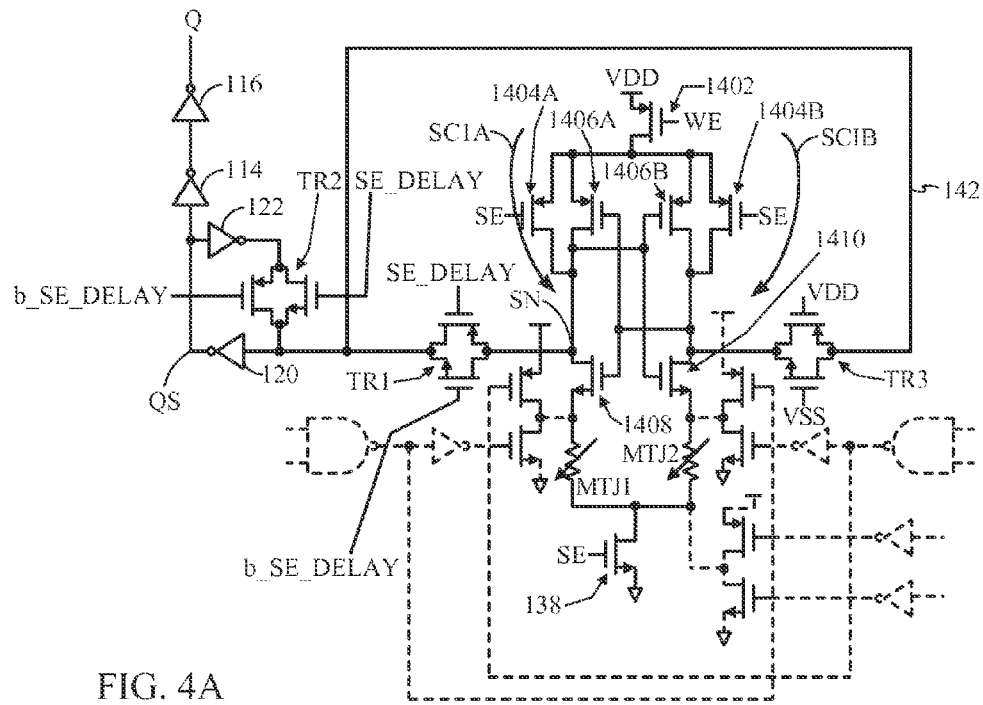
FIG. 4A shows an equivalent circuit and current flow diagram of the FIG. 1 example isolatable retention flip-flop during one first sensing step of one sensing process according to one sensing aspect of one isolatable retention flip-flop according to one exemplary embodiment.

Referring to FIG. 4A, an example operation can begin when SE transitions from high to low. The high to low transition of SE switches the NMOS sink switch 138 OFF, switches ON the first branch precharge enable switch 1404A and switches ON the second branch precharge enable switch 1404B. It will be assumed that the delay of the SE_DELAY is such that SE_DELAY is still high, i.e., has not yet transitioned from high to low. Therefore, the transmission gate TR1 is OFF. The switching ON of the first branch precharge enable switch 1404A and second branch precharge enable switch 1404B allows current to flow through the sense head switch 1402, and as flow as current SC1A through the first branch precharge enable switch 1404A to precharge a parasitic capacitance associated with the sense node SN, and flow as current SC1B through the second branch precharge enable switch 1404B to precharge a parasitic capacitance associated with the complementary sense node SN.

Referring still to FIG. 4A and continuing with description of example processes in sensing MTJ1 and MTJ2 according to one or more exemplary embodiments, after the high-to-low transition of SE, since there not is yet a substantial leak path from the sense node SN to ground, or from the complementary sense node CSN to ground, the described parasitic capacitances will continue to charge, causing the voltage at SN and at CSN to rise toward VDD. The voltage at SN cross couples to the gate of the second branch upper current switch 1406B, and the voltage at CSN cross couples to the gate of the first branch upper current switch 1406A. The voltage at SN is also cross coupled to the gate of the second branch lower sense current switch 1410, which is NMOS and, similarly, the voltage at CSN cross couples to the first branch lower sense current switch 1408, which is also NMOS. The first branch lower sense current switch 1408 and second branch lower sense current switch 1410, being NMOS, are therefore biased ON. However, SE is still low and, therefore, the NMOS sink switch 138 is OFF, not allowing current flow through MTJ1 and MTJ2.

Figure 4B:
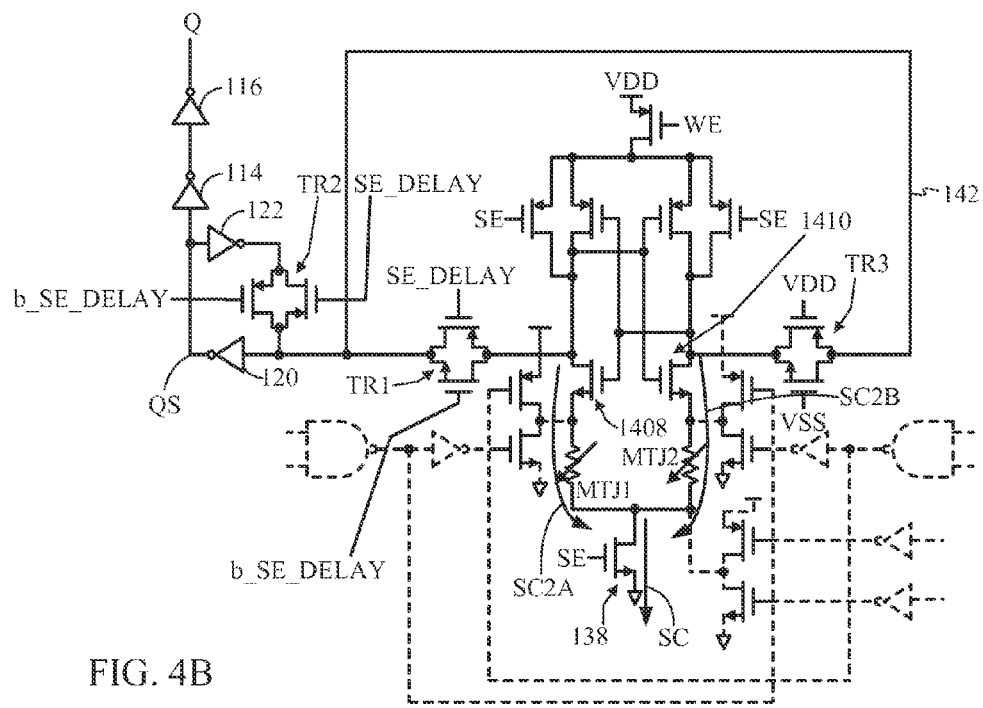
FIG. 4B shows an equivalent circuit and current flow diagram of the FIG. 1 example isolatable retention flip-flop during one second sensing step of one sensing process according to one sensing aspect of one isolatable retention flip-flop according to one exemplary embodiment.

Referring to FIG. 4B and continuing with description of example processes in sensing MTJ1 and MTJ2 according to one or more exemplary embodiments, at some time after the high-to-low transition of SE, but before a transition of SE_DELAY, SE returns to its high state. The low-to-high transition of SE switches the first branch precharge enable switch 1404A and the second branch precharge enable switch 1404B OFF, and switches the NMOS sink switch 138 ON. Since, as previously described, the first branch lower sense current switch 1408 is ON, the charge of the parasitic capacitance on SN can pass as current SC2A through MTJ1, through the NMOS sink switch 138 to ground. Likewise, as the second branch lower sense current switch 1410 is ON, the charge of the parasitic capacitance on CSN can pass as current SC2B through MTJ2, through the NMOS sink switch 138 to ground.

Continuing to refer to FIG. 4B, assuming the parasitic capacitance associated with SN is approximately the same as the parasitic capacitance associated with CSN, each of SN and CSN will have approximately the initial charge immediately preceding the low-to-high transition of SE. However, as previously described, this example assumes MTJ1 is in a low resistance magnetization state and MTJ2 is in a high resistance magnetization state. Therefore, since the resistance of MTJ1 is lower than the resistance of MTJ2 the voltage at SN will decay more rapidly than the voltage at CSN. The second branch upper sense current switch 1406B will therefore switch ON before the first branch upper sense switch 1406A. The switching ON of the second branch upper sense switch 1406B will cause the voltage at CSN to go toward VDD. This, in turn, will switch OFF the first branch upper sense switch 1406A and, at the same time, will switch ON the first branch lower sense current switch 1408. The result will be SN discharging toward VSS or ground. This can be viewed as a temporary latching of SN at approximately VSS or ground.

As the voltage at SN discharges toward and, as previously described, is latched at ground the second branch upper current switch 1406B is switched further ON, and the second branch lower sense current switch 1410 switches OFF. This can be viewed as a temporary latching of CSN at approximately VDD.

Referring to FIG. 4B and continuing with description of example processes in sensing a complementary written state of MTJ1 and MTJ2 according to one or more exemplary embodiments, at some time concurrent with, or shortly after the above-described low-to-high transition of SE, and latching of the low (VSS or ground) voltage at SN and high (VDD) voltage at CSN, SE_DELAY switches or transitions from high to low and b_SE_DELAY switches or transitions from low to high. These transitions of SE_DELAY and b_SE_DELAY, in turn, switch ON the first transmission gate TR1 and switch OFF the second transmission gate TR2. The first transmission gate TR1, in its switched ON state then drives, for example through the inverter 120, the QS control node to a state corresponding to the low state at SN. The QS control node voltage can then, for example going through the Q inverting drive buffers 114 and 116, drive Q to the state corresponding to the sensed state of SN. At a time after the previously described driving of Q to a state corresponding to, in this example the low voltage at SN, SE_DELAY can switch or transition from low to high, and b_SE_DELAY can switch or transition from high to low. This transitioning of SE_DELAY and b_SE_DELAY, in turn, switches OFF the first transmission gate TR1 and switches ON the second transmission gate TR2, which latches QS at a state corresponding to the sensed low voltage at SN.

As previously described, the FIG. 1 IRFF 100 according to one or more exemplary embodiments includes an isolatable retention circuit 104 having MTJ1 and MTJ2 arranged in the same direction, with write control logic 130 to inject write current through one and then the other of these MTJs.

Figure 5A:
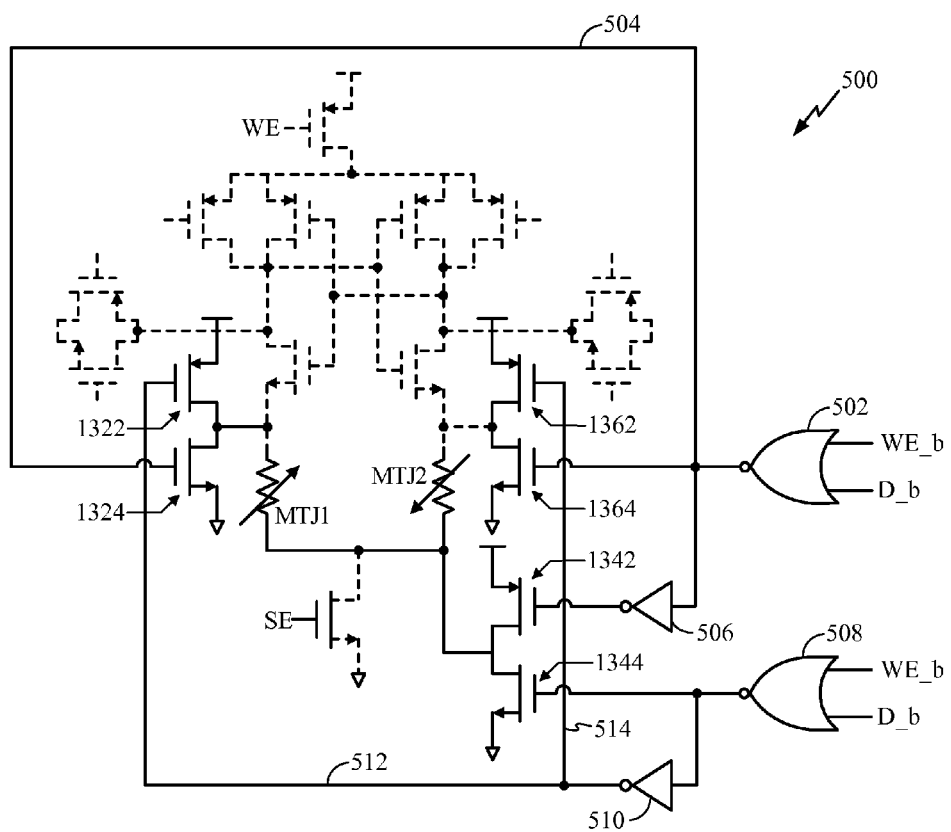
FIG. 5A shows a schematic diagram of one isolatable retention flip-flop according to another exemplary embodiment.
Figure 5B:
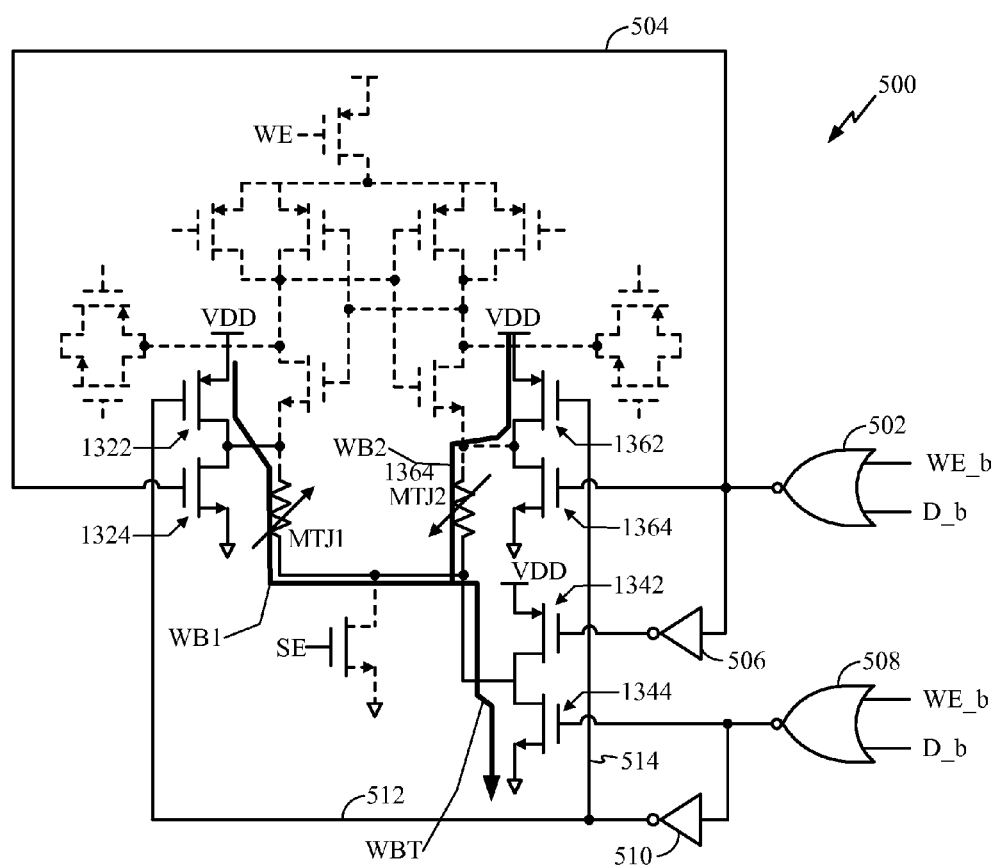
FIG. 5B shows an equivalent circuit and current flow diagram of the FIG. 5A example isolatable retention flip-flop during one one-step write process for storing one value according to one embodiment.
Figure 5C:
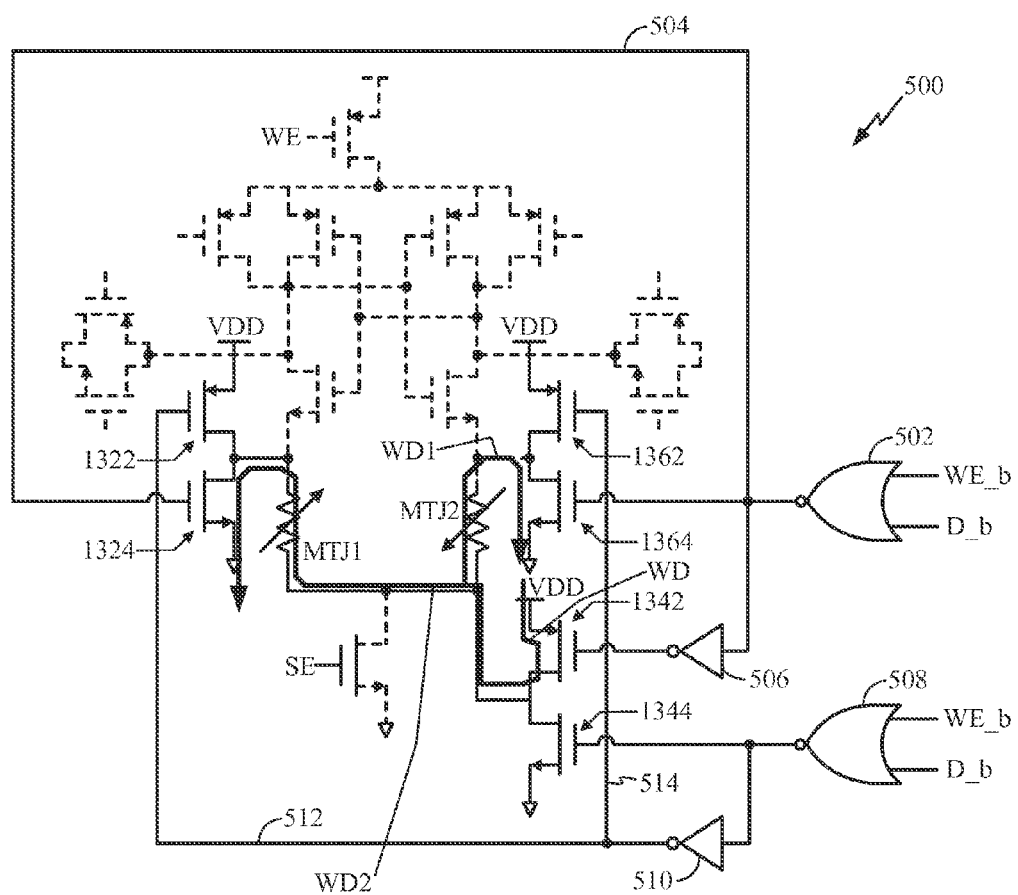
FIG. 5C shows an equivalent circuit and current flow diagram of the FIG. 5A example isolatable retention flip-flop during one write process for storing another value according to one embodiment.

FIG. 5A shows one alternative isolatable retention circuit ("alternative IRFF") 500, differing from the FIG. 1 example IRFF 100 by having one example of one alternative write logic that, according to one exemplary alternative embodiment, can be employed in place of, or alternative to, the IRFF 100 write control logic 130. FIGS. 5B and 5C show example switching states of the alternative IRFF 500. Referring to FIG. 5A, the alternative IRFF 500 includes the MTJ1 and MTJ2 being in opposite directions, with respect to their pinned layer and free layer relative to the direction of the sense current.

In an aspect, the sensing circuitry of the FIGS. 5A-5C alternative IRFF 500 can be the same as the sense circuit 140 in the isolatable retention circuit 104 shown in the FIG. 1 IRFF 100. For purposes of describing aspects illustrating novel concepts without unnecessary complexity, it will therefore be assumed that the alternative IRFF 500 uses the FIG. 1 sense circuit 140, which is represented in FIGS. 5A-5C in dotted lines.

In another aspect, the alternative IRFF 500 can employ the same first write switch 132, second write switch 134 and third write switch 136 as described in reference to FIGS. 1, 2A and 2B. As previously described, the first write switch 132 can be formed by PMOS pull-up driver 1322 and NMOS pull-down driver 1324, the second write switch 134 can be formed by PMOS pull-up driver 1342 and NMOS pull-down driver 1344, and the third write switch 136 can be formed by PMOS pull-up driver 1362 and NMOS pull-down driver 1364. The alternative IRFF 500 is shown in FIGS. 5A-5C utilizing the PMOS pull-up switch 1322.

Referring to FIG. 5A, the example write circuitry of the alternative IRFF 500 in place of the FIG. 1 write control logic 130 includes a first NOR gate 502 receiving WE_b, the complement of WE (write enable), and receiving D_b, the complement of D (data in). The output of the first NOR gate 502 controls, via control line 504, the NMOS pull-down driver 1324. The output of the first NOR gate 502 also controls, through the inverter 506, the PMOS pull-up driver 1342. The write circuitry of the alternative IRFF 500 further includes a second NOR gate 508 receiving the same WE_b received by the first NOR gate 502, but receiving D as opposed to D_b. The output of the second NOR gate 508 controls the NMOS pull-down driver 1344 and, through the inverter 506 and control lines 512 and 514, controls the PMOS pull-up drivers 1322 and 1362, respectively.

According to one exemplary embodiment that can be practiced on the alternative IRFF 500, a one-step write of MTJ1 and MTJ2 can be provided. In an aspect, the alternative IRFF 500 provides the one-step write by injecting a write current through MTJ1 in parallel with a write current through MTJ2, in a selectable direction, as described in greater detail in reference to FIGS. 5B and 5C. FIG. 5B shows one example according to this aspect performing a writing of one set of states in MTJ1 and MTJ2, and FIG. 5C shows one example writing another set of states in MTJ1 and MTJ2, opposite the set written in FIG. 5B. It will be understood that "set of states," in this context, means one of a "0" and "1" state in MTJ1 and the other of the "0" and "1" state in MTJ2. Referring to FIGS. 5B and 5C, the described example processes assume for FIG. 5B that D="1," and for FIG. 5C D="0," and that for a write process WE switches to a "1" and, therefore WE_b switches to a "0."

Referring to FIG. 5B, the example can begin with WE switching from a "0" to a "1," and likewise WE_b switching in a complementary fashion. Since, as described above D="1," the output of the second NOR gate 508 is "1," which switches the NMOS pull-down driver 1344 ON. The "1" output of the second NOR gate 508, through the inverter 510, switches the PMOS pull-up driver 1322 ON and switches the PMOS pull-up driver 1342 OFF. D_b is "0" and therefore the output of the first NOR gate 502 is "0." The "0" output from the first NOR gate 502 switches OFF the NMOS pull-down driver 1364 and switches OFF the NMOS pull-down driver 1322. The first NOR gate 502 output of "0," through the inverter 506, switches OFF the PMOS pull-up driver 1342. The result, as shown in FIG. 5B, is a write current WB1 sourced from the VDD coupled to the PMOS pull-up driver 1322, passing through MTJ1 and through the NMOS pull-down switch 1344 to ground, and a write current WB2 sourced from the VDD coupled to the PMOS pull-up driver 1362, passing through MTJ2 and also through the NMOS pull-down driver 1344 to ground. The total of WB1 and WB2 passing through the NMOS pull-down driver 1344 to ground is labeled "WBT.

Referring to FIG. 5C, in an example where D="0" the output of the second NOR gate 508 is "0," which switches the NMOS pull-down driver 1344 OFF. The "0" output of the second NOR gate 508, through the inverter 510, switches the PMOS pull-up driver 1322 OFF and switches the PMOS pull-up driver 1362 OFF. D_b is "1" and therefore the output of the first NOR gate 502 is "1." The "1" that is output from the first NOR gate 502 switches ON the NMOS pull-down driver 1364, switches ON the NMOS pull-down driver 1324 and, through the inverter 506, switches ON the PMOS pull-up driver 1342. The result, as shown in FIG. 5C, is a write current WD sourced from the VDD coupled to the PMOS pull-up driver 1342, and branching into the write current WD2 through MTJ1 and through the NMOS pull-down driver 1324 to ground, and the write current WD1 through MTJ2 and through the NMOS pull-down driver 1364 to ground.

It will be appreciated that the alternative IRFF 500 described in reference to FIGS. 5A-5C does not require a global write signal generator, for example the FIG. 3 global write signal generator 300, as was required for the IRFF 100 described in reference to FIGS. 1, 2A, and 2B.

Figure 6:
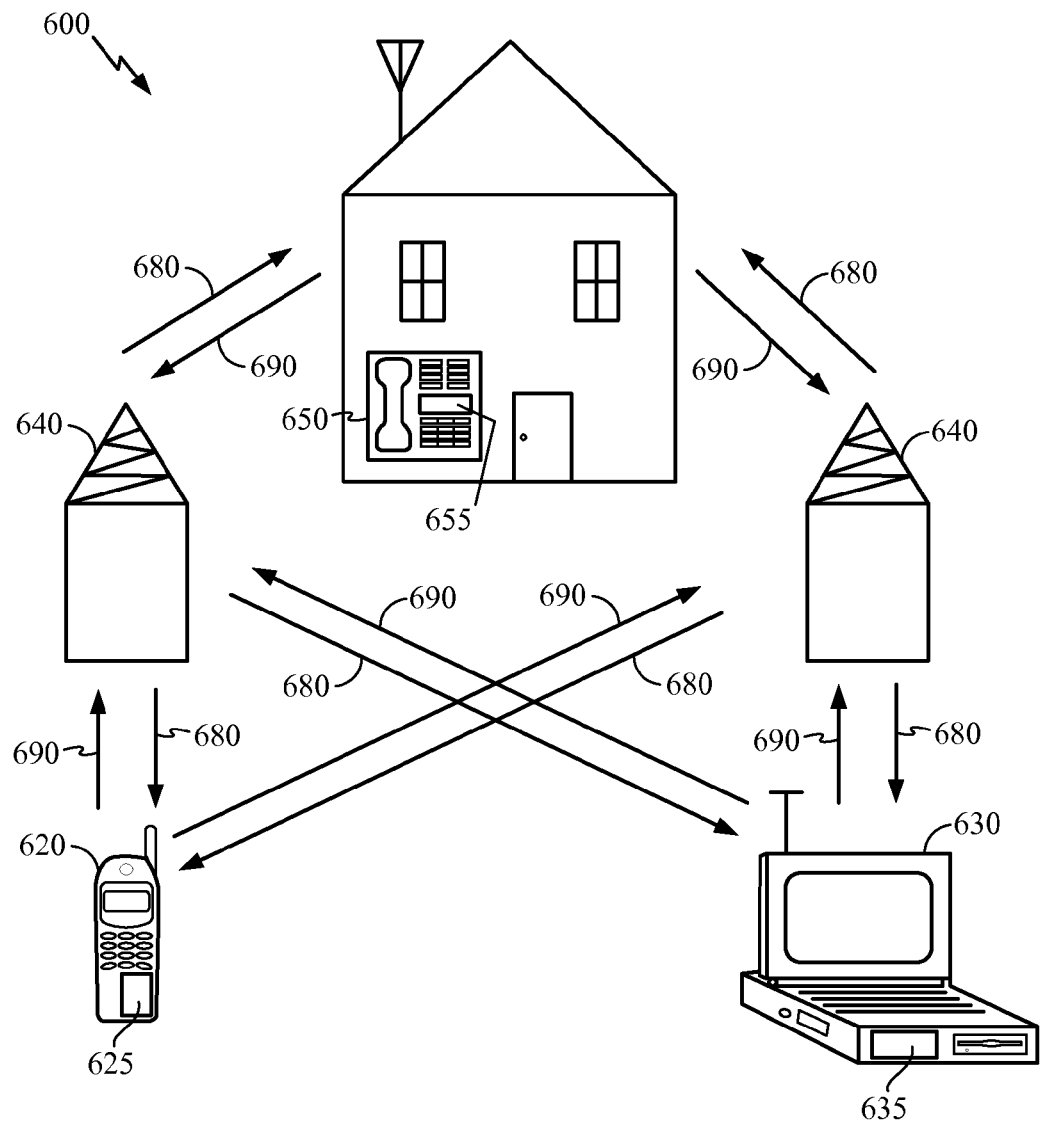
FIG. 6 is a functional block diagram of example personal computing devices according to one or more exemplary embodiments.

FIG. 6 illustrates an exemplary wireless communication system 600 in which one or more embodiments of the disclosure may be advantageously employed. For purposes of illustration, FIG. 6 shows three remote units 620, 630, and 650 and two base stations 640. It will be recognized that conventional wireless communication systems may have many more remote units and base stations. The remote units 620, 630, and 650 include semiconductor devices 625, 635 and 655 (including non-volatile flip-flops, as disclosed herein), which are among embodiments of the disclosure as discussed further below. FIG. 6 shows forward link signals 680 from the base stations 640 and the remote units 620, 630, and 650 and reverse link signals 690 from the remote units 620, 630, and 650 to the base stations 640.

In FIG. 6, the remote unit 620 is shown as a mobile telephone, the remote unit 630 is shown as a portable computer, and the remote unit 650 is shown as a fixed location remote unit in a wireless local loop system. For example, the remote unit may be one or more of a mobile phone, hand-held personal communication systems (PCS) unit, portable data units such as a personal data assistant, navigation devices (such as GPS enabled devices), set top box, music player, video player, entertainment unit, fixed location data unit such as a meter reading equipment, or any other device that stores or retrieves data or computer instructions, or any combination thereof. Although FIG. 6 illustrates remote units according to the teachings of the disclosure, the disclosure is not limited to these exemplary illustrated units. Embodiments of the disclosure may be suitably employed in any device which includes at least one semiconductor die having active integrated circuitry including memory and on-chip circuitry for test and characterization.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for phase sampling a received serial bit stream as according to methods of described embodiments. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A nonvolatile flip-flop apparatus, comprising:
a flip-flop having an output control node driving an output of the nonvolatile flip-flop apparatus;
an isolation switch selectively coupling a retention sense node to the output control node;
a sense circuit configured to selectively couple an external sense current source to the retention sense node; and
a resistive element, having a magneto-resistive element, selectively coupled by the sense circuit to the retention sense node,
wherein the sense circuit is configured to have a precharging mode and a sensing mode, and to precharge the retention sense node during the precharging mode with a precharging current, and to pass the precharging current through the magneto-resistive element during the sensing mode.

2. The nonvolatile flip-flop apparatus of claim 1, wherein the sense circuit is configured to control the isolation switch to couple the retention sense node to the output control node during the sensing mode.

3. The nonvolatile flip-flop apparatus of claim 1, wherein the magneto-resistive element includes a first magnetic tunnel junction (MTJ) element and a second MTJ element.

4. The nonvolatile flip-flop apparatus of claim 3, wherein the first MTJ element has a free layer and a pinned layer, and the second MTJ element has a free layer and a pinned layer, and wherein a write circuit is configured to receive a data and selectively inject a write current through the first MTJ element in a first direction with respect to its free layer and its pinned layer, and to selectively inject a write current through the second MTJ element in a second direction, wherein the second direction is the same as the first direction.

5. The nonvolatile flip-flop apparatus of claim 4, wherein the sense circuit is configured to pass the precharging current through the first MTJ element and the second MTJ element during the sensing mode.

6. The nonvolatile flip-flop apparatus of claim 5, wherein the sense circuit is configured to control the isolation switch to couple the retention sense node to the output control node during the sensing mode.

7. The nonvolatile flip-flop apparatus of claim 5, wherein the sense circuit is configured to uncouple, during the precharging mode, the first MTJ element from ground concurrent with uncoupling the second MTJ element from ground, and to couple, during the sensing mode, the first MTJ element to ground concurrent with coupling the second MTJ element to ground.

8. The nonvolatile flip-flop apparatus of claim 5, wherein the sense circuit includes a sink switch configured to selectively concurrently couple the first MTJ element and the second MTJ element to ground and concurrently uncouple the first MTJ element and the second MTJ element from ground.

9. The nonvolatile flip-flop apparatus of claim 5, wherein the sense circuit includes a sense current head switch configured to receive a write enable signal having a write enabling value and a not write enabling value, and, in response to the write enabling value, to uncouple the retention sense node from the external sense current source.

10. The nonvolatile flip-flop apparatus of claim 3, wherein a write circuit is configured to receive a write enable and a data and, in response, to inject a first write current through the first MTJ concurrently with injecting a second write current through the second MTJ.

11. The nonvolatile flip-flop apparatus of claim 10, wherein the write circuit is configured to inject the first write current in a first direction with respect to the free layer and the pinned layer of the first MTJ, concurrent with injecting the second write current through the second MTJ in a second direction with respect to the free layer and the pinned layer of the second MTJ, wherein the second direction is the opposite of the first direction.

12. The nonvolatile flip-flop apparatus of claim 1, wherein the nonvolatile flip-flop apparatus is integrated in at least one semiconductor die.

13. The apparatus of claim 12, further comprising a device, selected from the group consisting of a set top box, music player, video player, entertainment unit, navigation device, communications device, personal digital assistant (PDA), fixed location data unit, and a computer, into which the apparatus is integrated.

14. A method for nonvolatile storage of a logical state of a flip-flop output, comprising:
forming a sense voltage on a sensing node of a resistance memory switchable between a plurality of storage states, the sense voltage being indicative of the storage state of the resistance memory;
coupling the sensing node to an output control node driving the flip-flop output;
latching the output control node of the flip-flop at a logical state in accordance with the sense voltage received at the output control node through said coupling the sensing node; and
uncoupling the sensing node from the output control node of the flip-flop,
wherein forming the sense voltage on the sensing node of the resistance memory includes precharging a parasitic capacitance coupled to the sensing node followed by forming a current path from the sensing node through the resistance memory element to a ground reference.

15. The method of claim 14, wherein precharging the parasitic capacitance includes forming a current path from a voltage rail to the sensing node, wherein said current path includes a series connection from the voltage rail to the sensing node, and wherein the series connection includes a write current head switch in an ON state in series with a sense current transistor in an ON state.

16. The method of claim 15, wherein writing the resistance memory includes, concurrent with injecting the write current, switching the write current head switch to an OFF state.

17. The method of claim 14, wherein precharging the parasitic capacitance includes forming a current path from a voltage rail to the sensing node concurrent with a removing of the current path from the resistance memory element to the ground reference.

18. The method of claim 14, further comprising:
receiving a clock and a data; and
latching the output control node of the flip-flop in accordance with the clock and the data while the sensing node is uncoupled from the output control node.

19. An apparatus for nonvolatile storage of a logical state of a flip-flop output, comprising:
means for forming a sense voltage on a sensing node of a resistance memory writable to a plurality of storage states, the sense voltage indicative of the storage state of the resistance memory;
means for switchably coupling the sensing node to an output control node driving the flip-flop output; and
means for latching the output control node of the flip-flop at a logical state in accordance with the sense voltage received at the output control node through said coupling the sensing node to the output control node,
wherein the means for forming the sense voltage on the sensing node of the resistance memory includes means for precharging a parasitic capacitance coupled to the sensing node followed by forming a current path from the sensing node through the resistance memory element to a ground reference.

20. The apparatus of claim 19, further comprising:
means for receiving a clock and a data; and
means for latching the output control node of the flip-flop in accordance with the clock and the data while the sensing node is uncoupled from the output control node.

21. The apparatus of claim 19, wherein the apparatus is integrated in at least one semiconductor die.

22. The apparatus of claim 21, further comprising a device, selected from the group consisting of a set top box, music player, video player, entertainment unit, navigation device, communications device, personal digital assistant (PDA), fixed location data unit, and a computer, into which the apparatus is integrated.

23. A method for nonvolatile storage of a logical state of a flip-flop output, comprising:
step of forming a sense voltage on a sensing node of a resistance memory switchable between a plurality of storage states, the sense voltage being indicative of the storage state of the resistance memory;
step of coupling the sensing node to an output control node driving the flip-flop output;
step of latching the output control node of the flip-flop at a logic state in accordance with the sense voltage received at the output control node through said coupling the sensing node; and
step of uncoupling the sensing node from the output control node of the flip-flop,
wherein the step forming the sense voltage on the sensing node of the resistance memory includes step of precharging a parasitic capacitance coupled to the sensing node followed by step of forming a current path from the sensing node through the resistance memory element to a ground reference.

24. A nonvolatile flip-flop apparatus, comprising:
a flip-flop having an output control node driving an output of the nonvolatile flip-flop apparatus;

an isolation switch selectively coupling a retention sense node to the output control node;
a sense circuit configured to selectively couple an external sense current source to the retention sense node; and
a resistive element, having a magneto-resistive element, selectively coupled by the sense circuit to the retention sense node,
wherein the isolation switch is a first isolation switch, and wherein the nonvolatile flip-flop apparatus further comprises a latch comprising:
a first inverting buffer an input coupled to the output control node of the flip-flop and having an output;
a second inverting buffer having an input coupled to the first isolation switch and output coupled to the output control node of the flip-flop; and
a second isolation switch coupled between the output of the first inverting buffer and the input of the second inverting buffer.

25. The nonvolatile flip-flop apparatus of claim 24, wherein the flip-flop comprises:
a logic gate comprising:
a PMOS switch having a source coupled to an external power rail, a gate configured to receive an external clock, and a drain;
a first NMOS switch having a drain coupled to the drain of the PMOS switch, a source and a gate configured to receive a delayed, inverted version of the external clock;
a second NMOS switch having a drain coupled to the source of the first NMOS switch, a source, and a gate configured to receive a data input; and
a third NMOS switch having a drain coupled to the source of the second NMOS switch, a source coupled to an external ground rail, and a gate configured to receive the external clock; and
a tri-state output buffer configured to be controlled by the external clock and a signal on the drain of the PMOS switch of the logic gate,
wherein the output control node of the flip-flop is a tri-state output of the output buffer.

26. A nonvolatile flip-flop apparatus, comprising:
a flip-flop having an output control node driving an output of the nonvolatile flip-flop apparatus;
an isolation switch selectively coupling a retention sense node to the output control node;
a sense circuit configured to selectively couple an external sense current source to the retention sense node; and
a resistive element, having a magneto-resistive element, selectively coupled by the sense circuit to the retention sense node,
wherein the flip-flop comprises:
a logic gate comprising:
a PMOS switch having a source coupled to an external power rail, a gate configured to receive an external clock, and a drain;
a first NMOS switch having a drain coupled to the drain of the PMOS switch, a source and a gate configured to receive a delayed, inverted version of the external clock;
a second NMOS switch having a drain coupled to the source of the first NMOS switch, a source, and a gate configured to receive a data input; and
a third NMOS switch having a drain coupled to the source of the second NMOS switch, a source coupled to an external ground rail, and a gate configured to receive the external clock; and
a tri-state output buffer configured to be controlled by the external clock and a signal on the drain of the PMOS switch of the logic gate,
wherein the output control node of the flip-flop is a tri-state output of the tri-state output buffer.

* * * * *